United States Patent [19]
Hassoun et al.

[11] Patent Number: 5,557,622
[45] Date of Patent: Sep. 17, 1996

[54] METHOD AND APPARATUS FOR PARITY GENERATION

[75] Inventors: Soha M. N. Hassoun, Worcester; Douglas E. Sanders, Framingham, both of Mass.

[73] Assignee: Digital Equipment Corporation, Maynard, Mass.

[21] Appl. No.: 518

[22] Filed: Jan. 4, 1993

Related U.S. Application Data

[63] Continuation of Ser. No. 591,195, Oct. 1, 1990, abandoned.
[51] Int. Cl.$^6$ .................... G06F 11/10; H03M 13/00
[52] U.S. Cl. ............... 371/49.1; 371/49.3; 371/49.4
[58] Field of Search ................ 371/49.1, 48, 49.3, 371/49.2, 50.1, 49.4, 51.1, 37.7

[56] References Cited

U.S. PATENT DOCUMENTS

| | | | |
|---|---|---|---|
| 3,772,680 | 11/1973 | Kawai et al. | 340/347 DD |
| 3,909,783 | 9/1975 | Kashio | 371/49.1 |
| 4,429,391 | 1/1984 | Lee | 371/49.1 |
| 4,580,265 | 4/1986 | Gooding et al. | 371/49.1 |
| 4,757,504 | 7/1988 | Stambaugh et al. | 371/49.1 |
| 4,879,675 | 11/1989 | Brodnax | 364/738 |

*Primary Examiner*—Robert W. Beausoliel, Jr.
*Assistant Examiner*—Ly V. Hua
*Attorney, Agent, or Firm*—Arthur W. Fisher; Denis G. Maloney; Lindsay McGuinness

[57] ABSTRACT

A parity generator for multibit binary data in which only a subset of bits change at one time includes a circuit for determining whether the number of bits in the subset to be changed is odd or even. A toggle signal generator generates a toggle signal only if the number of bits to be changed is odd. A toggling circuit selectively changes the level of the parity bit in response to the toggle signal.

4 Claims, 4 Drawing Sheets

| P | TAG | D1 | D2 | D3 | D4 | V1 | V2 | V3 | V4 | P |

FIGURE 3

METHOD AND APPARATUS FOR PARITY GENERATION

CROSS REFERENCE TO RELATED APPLICATIONS

This application is a continuation of application Ser. No. 07/591,195, filed Oct. 1, 1990, now abandoned.

The present application is related to the following applications filed at the same time as this application:

U.S. patent application Ser. No. 591,198 (pending) (PD91-0044), by Michael A. Callander and Douglas Elliott Sanders, entitled A TWO-LEVEL PROTOCOL FOR MULTI-COMPONENT BUS OWNERSHIP, AND IMPLEMENTATION IN A MULTI-PROCESSOR CACHE WRITE BACK PROTOCOL;

U.S. patent application Ser. No. 591,197 (pending) (PD91-0045), by Douglas Elliott Sanders and Michael A. Callander, entitled METHOD AND APPARTATUS FOR FILTERING INVALIDATE REQUESTS;

U.S. patent application Ser. No. 591,196 (pending) (PD91-0046), by Michael A. Callander, Linda Chao and Douglas Elliott Sanders, entitled APPARATUS FOR SUPPRESSING AN ERROR REPORT FROM AN ADDRESS FOR WHICH AN ERROR HAS ALREADY BEEN REPORTED;

U.S. patent application Ser. No. 591,199 (pending) (PD91-0048), by Michael A. Callander, entitled WRITE-BACK CACHE WITH ECC PROTECTION; and U.S. patent application Ser. No. 591,186 (pending) (PD91-0049), by Douglas Elliott Sanders, Michael A. Callander and Linda Chao, entitled METHOD AND APPARATUS FOR COMPLETING A DEFERRED READ REQUEST IN THE PRESENCE OF AN ERROR.

BACKGROUND OF THE INVENTION

The present invention relates to computer systems including cache memories improved to increase reliability.

Computer systems include a processor and a memory for holding instructions and data for processing by the processor. In order to decrease the latency time of memory accesses, computer systems often use a known technique known as a cache memory. In a computer system utilizing cache memory, a main memory, which holds all the instructions and data for the processor, is coupled to the processor over a system bus; but a smaller, faster memory is coupled to the processor over a fast local bus. The cache memory holds a subset of the data stored in the main memory.

If the processor requests data at an address which is in the cache memory, called a cache hit, then the request may be granted in a much shorter time because the cache memory itself operates faster than the main memory, and because it is coupled to the processor over the local bus which operates faster than the system bus. Only if the address of the requested data is not in the cache memory, called a cache miss, is the memory request forwarded to the main memory, which operates slower than the cache memory, and is coupled to the processor over the slower system bus. The actual increase in speed resulting from use of a cache memory depends upon the ratio of the number of memory accesses which are filled from the cache memory to the total number of memory accesses, called the hit-ratio. In order to maximize the hit-ratio, when one piece of data is transferred from the main memory to the cache memory, some further amount of data from addresses in the neighborhood of that of the requested piece of data, called a block, is transferred to the cache memory at the same time, a process known as cache fill.

The increase in access speed resulting from use of a cache memory is even more if the computer system is a multiprocessor computer system. A multiprocessor computer system consists of several processor modules, each including a processor, which share a single main memory. All of the processor modules must share the system bus, and if it is busy, the processors which have a bus request must wait until it is free. This imposes yet another delay in satisfying a memory request which is a cache miss. In such a computer system, each processor module may include its own cache memory.

In some computer systems, the cache memory in each processor module is configured as a write-back cache. In a write-back cache, when a request to write data is processed, the main memory block into which the data is to be written is transferred to the cache memory of the processor module from main memory, and that block in the cache RAMs is marked in the main memory as being "owned" by that processor module. No other module is allowed to write to that block. Subsequent writes to that block take place within the cache memory only. This decreases the system bus accesses, thus, decreasing memory access time. However, the cache memory of that particular processor module contains the only accurate copy of that block. Because the cache memory may contain the only accurate copy of memory data, it is important that the data in the cache memory, and access to it, be protected as much as possible.

A cache memory includes random access memories (RAMs) for containing the data in the cache memory, and a controller for controlling the cache memory. The cache RAMs are divided into a number of blocks, each of which may contain a block of data from the main memory. The cache controller keeps track of which main memory blocks are currently in the cache RAMs by maintaining a storage device which includes one location for each block in the cache RAMs. Each location in the storage device contains a first portion, called a tag, which identifies which main memory block is in the corresponding block; and a second portion which contains the status of that block in the cache RAMs. For example, each block in the cache RAMs may be valid or invalid, or may be writable (called dirty) or read-only. Because this storage device contains tags identifying which main memory blocks are in which blocks in the cache RAMs, this device is called a tag store.

The processor requests memory accesses by sending the main memory address of the desired data to the cache controller. The cache controller checks the tag store to determine whether the desired main memory address is stored in the cache RAMs and whether the block in the cache RAMs is valid. If the request is for a memory write, the cache controller also checks the tag store to determine if the block in the cache RAMs is dirty (writable). If the addressed data is in the cache RAMs and valid (and dirty for a write access) then the cache controller issues the proper signals to the cache RAMs to make the requested data transfer. If the desired data is not in the cache RAMs, or if the block is not valid (or not valid and dirty for a write access), then the cache controller requests the desired data from the main memory, sends the desired data to the processor when it is available, fills the remainder of the block in the cache RAMs, and updates the tag store.

In a multiprocessor computer system, it is necessary for all the cache memories to contain accurate information. This entails keeping track of the main memory accesses on the system bus. For example, if a processor module owns a block (i.e. has write privileges) and another processor module requests a read from or write to that block, then the first processor module must write-back that block into main memory so the second processor module may have access to it, and mark that block in the cache RAMs as being not valid and not dirty. Alternatively, if the first processor module has a read-only copy of a block, and a second processor module requests a write to that block, then that block in the cache RAMs must be marked invalid. The processor module includes circuitry to monitor the memory requests on the system bus and to check each one in the tag store in the cache controller to determine whether a write-back or invalidate must be performed on the block.

Some write-back cache controllers subdivide the blocks into subblocks, each of which have different write privileges. For example, each block may be divided into four subblocks. In order to maintain the status of these subblocks, each location in the tag store would maintain four sets of status indicators, one for each of the subblocks in that block. In such a cache memory, only the dirty subblock must be written back upon a request for an address in that block by a different processor module.

In order to enhance the reliability of access to the data, cache memories include some way of protecting access to the tag store. One method used is to include some error detection coding in the tag store. For example, parity bits may be included in each location in the tag store. Also, if there are multiple status bits, a parity bit may also be appended to the status bits. Whenever a new tag and status bits are written, the parity bits are generated. Whenever the tag and status bits are accessed, the parity of the accessed data is checked. As long as the parity is correct, there is no change in the operation of the cache memory. If it is incorrect, then it is not possible to accurately determine which main memory block is in the corresponding block in the cache RAMs. In this situation, an error is reported and the cache memory alters its operation. The processor may initiate an error recovery program to diagnose and correct the tag store problem in response to the error signal. In addition, the cache memory may partially turn off. For example, all memory requests may be treated as cache misses (requiring direct access to the main memory) except for those accesses to dirty blocks. Because dirty blocks contain the only accurate copy of that data, the cache memory must continue to satisfy requests to dirty blocks. U.S. patent application Ser. No. 07/547,597, filed Jun. 29, 1990, entitled ERROR TRANSITION MODE FOR MULTIPROCESSOR SYSTEM, by Stamm et al., describes a method and apparatus for implementing a write-back cache memory system in a multiprocessor computer system.

In the case of the tag data, when a new tag is written into the tag store, the parity must be generated over the entire new tag because there is no relationship between the previous contents of the tag portion of that location and the new contents. However, in the case of the a multibit status portion of the that location, only a subset of the status bits change at any time.

As described above, for any subblock, there is one valid bit and one dirty bit. If the valid bit is a logic '0' signal, then the subblock is invalid. If the valid bit is a logic '1' signal, and the dirty bit is a logic '0' signal, then the block is valid and read-only. If the valid bit is a logic '1' signal and the dirty bit is a logic '1' signal, then the block is valid and writable. Only one of four transactions can be performed on a subblock of cache memory: 'make valid', 'make valid and dirty', 'make not valid' and 'make not valid and not dirty'. Thus, for any particular transaction on the tag store, only two status bits are changing at any one time.

In order to decrease the latency time of the cache memory, it is desireable to decrease the time needed to update the parity bit when the status of a subblock is changed in the cache memory.

SUMMARY OF THE INVENTION

In accordance with principles of the present invention, a parity generator for multibit bilevel data in which only a subset of bits change at one time, includes a circuit for determining whether the number of bits in said subset to be changed is odd or even. A toggle signal generator generates a toggle signal only if the number of bits to be changed is odd. A toggling circuit changes the level of the parity bit in response to said toggle signal.

Apparatus in accordance with principles of the present invention provides an updated parity bit for eight bits of data (four valid bits and four dirty bits) in a shorter amount of time than it would take to calculate the parity over the entire eight bits using the conventional parity tree apparatus. This allows for faster tag store updating and decreased latency time. In addition, less circuitry and less area is required on an integrated circuit on which such circuitry is fabricated, thus decreasing costs and increasing reliability.

BRIEF DESCRIPTION OF THE DRAWINGS

In the drawings:

FIG. 3 is a diagram illustrating the arrangement of bits in a memory location of a tag store in a cache controller as illustrated in FIG. 2.

DESCRIPTION OF THE PREFERRED EMBODIMENT

Figure 1:
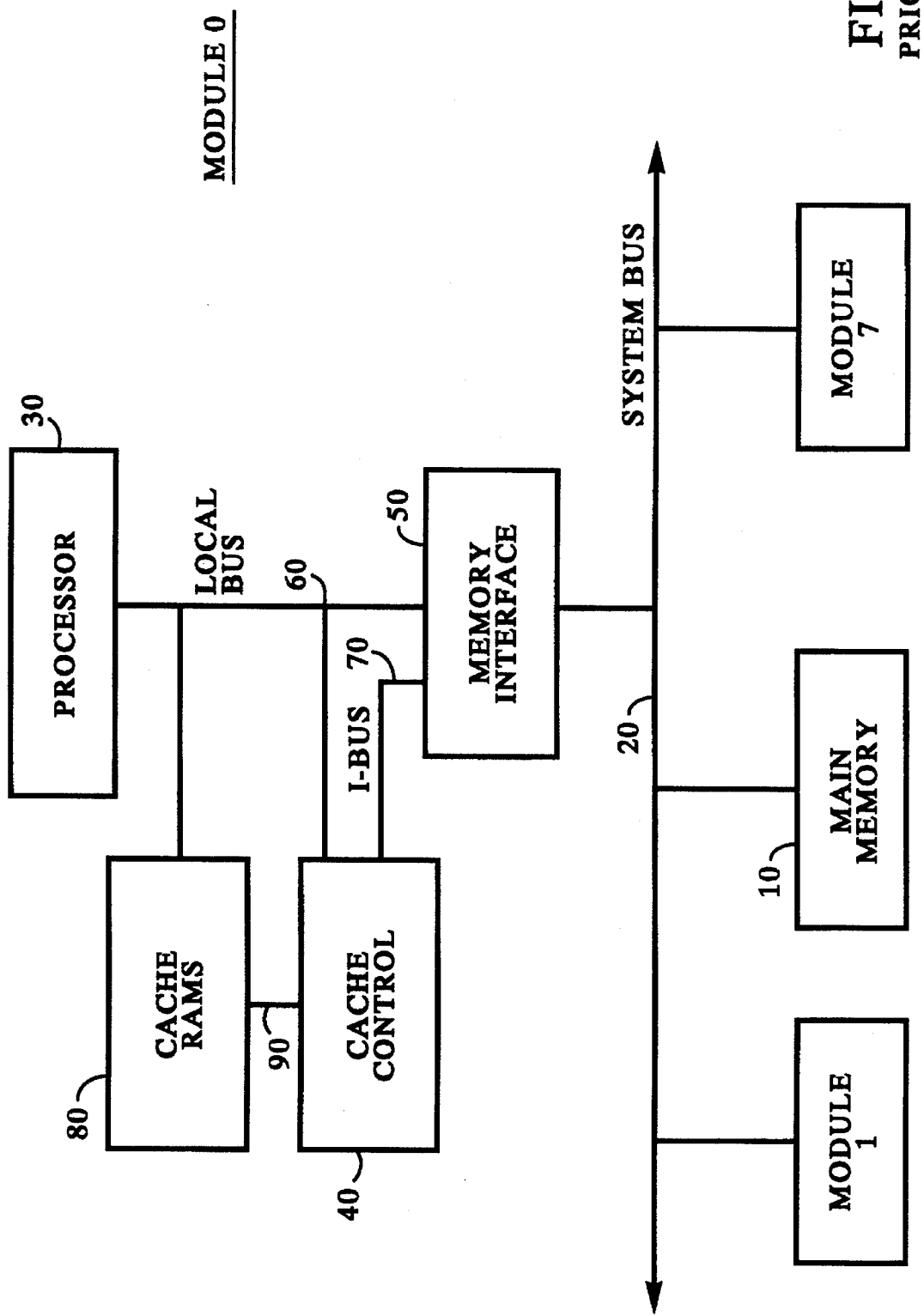
FIG. 1 is a block diagram of a multiprocessor computer system in accordance with principles of the present invention.

FIG. 1 is a block diagram of a multiprocessor computer system in accordance with principles of the present invention. In FIG. 1, a plurality of processor modules are coupled to a main memory 10 over a system bus 20. In FIG. 1, three processor modules, 0, 1 and 7, are illustrated as being connected to system bus 20. One skilled in the art of computer design will understand that any number of processor modules could be coupled to system bus 20.

Processor module 0 is illustrated in more detail in FIG. 1. In module 0, a processor 30 is coupled to a cache controller 40 and a memory interface 50 over a local bus 60 consisting of data lines, address lines and associated control and timing lines. Processor 30 is also coupled to cache RAMs 80 over the data and address lines alone of the local bus. Memory interface 50 is coupled between the local bus 60 and the system bus 20. Memory interface 50 is also coupled to the cache controller 40 over an invalidate bus (I-bus) 70 containing address lines and memory access type lines. Cache controller 40 is coupled to cache RAMs 80 over a cache memory control bus 90 containing control and timing lines for the cache RAMs 80. The combination of cache controller 40 and cache RAMs 80 form a cache memory in processor module 0. There are further elements and interconnections within module 0 which are not essential to the understanding of the invention. For clarity, these elements and interconnections have been omitted from FIG. 1. One skilled in the art will know the other elements required in processor module 0 and would understand the interconnections necessary for their proper interaction. Modules 1 and 7 are similar to module 0 and will not be described in detail.

The cache memory operates in the known manner described above. When processor 30 requires data from memory, a request is made over the local bus 60 for the data at a desired address. Cache controller 40 checks the address in the tag store to determine if the block containing that address is presently stored in the cache RAMs 80. If the data is in the cache RAMs 80, then cache controller 40 provides the appropriate control signals to the cache RAMs 80 over the cache memory control bus 90 to access that data. The data is then transferred between the processor 30 and the cache RAMs 80.

If the data is not in the cache RAMs 80, then the cache controller produces a signal indicating this fact to the memory interface 50. Memory interface 50 generates a memory request for that main memory block over the system bus 20 to the main memory 10. When the main memory is ready for the transfer, memory interface 50 initiates the transfer of the desired data between the main memory 10 and the processor 30. The data is also simultaneously transferred between the main memory 10 and the cache RAMs 80. Then, the remainder of the data in the requested block is transferred between the main memory 10 and the cache RAMs 80. When the transfer is complete, cache controller 40 updates the tag store. The result of this activity is to place the requested block in the cache RAMs 80. Subsequent accesses will be satisfied from the cache memory, and will, thus, be faster.

Memory interface 50 is also monitoring memory accesses on the system bus 20. All memory accesses are sent to the cache controller 40 which checks the tag store to determine whether the accessed main memory block is in the cache RAMs 80. If it is not, then nothing is done. If it is, then the type of the main memory access and the status of the block in the cache RAMs are checked to determine whether an invalidate or write-back of that block of data need be performed. If an invalidate is required, the status portion of the corresponding location in the tag store is changed to indicate that that block is invalid. If a write-back is required, then the status of that block is changed to invalid and not dirty and that block of data is transferred from the cache RAMs 80 to the memory interface 50 over the local bus 60 using the known DMA technique. Memory interface 50 directs the transfer of the data to the main memory 10 over the system bus 20.

Figure 2:
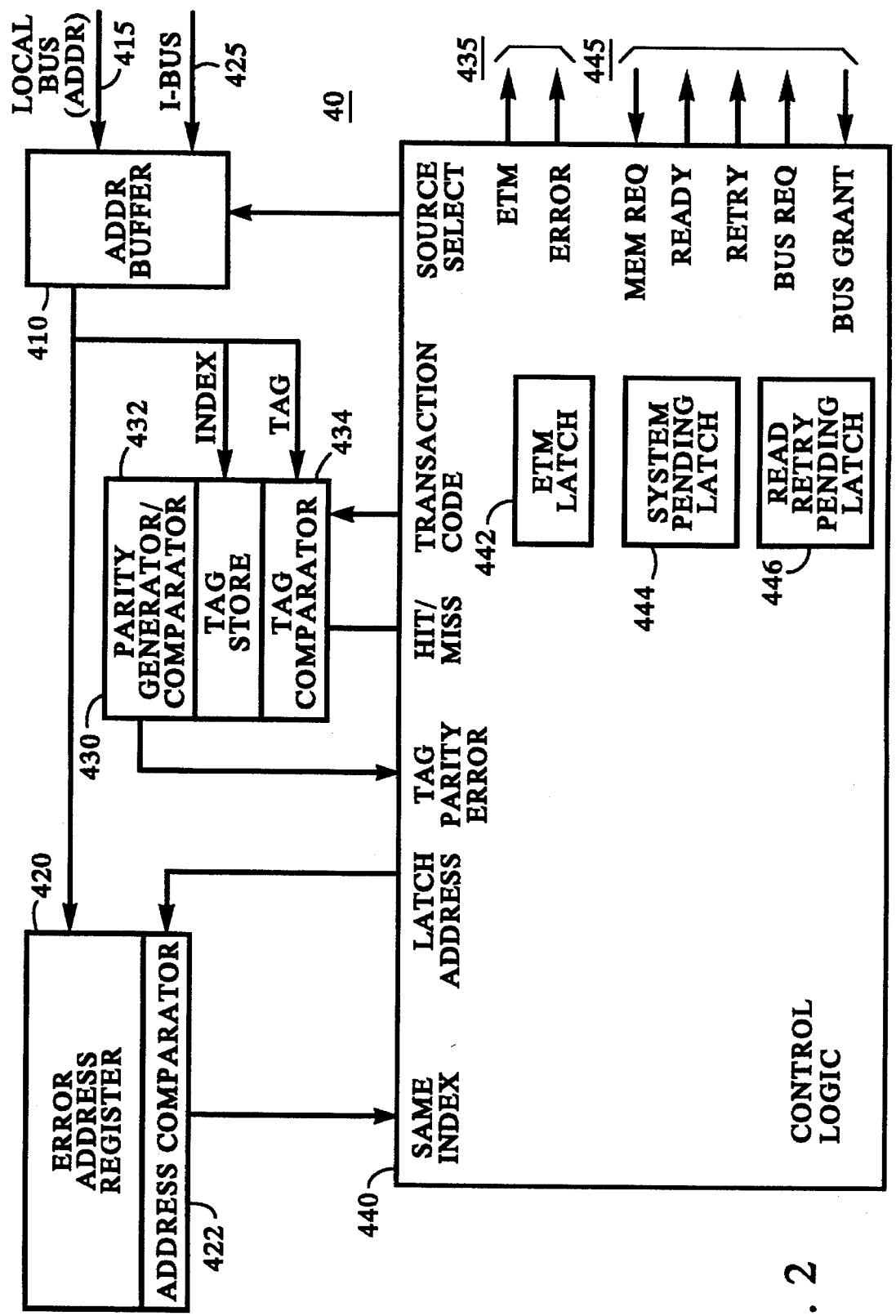
FIG. 2 is a block diagram of a portion of the cache controller illustrated in FIG. 1.

FIG. 2 is a block diagram of a portion of cache controller 40 (of FIG. 1). In FIG. 2, an input terminal 415 is coupled to the address portion of the local bus 60 (of FIG. 1) and input terminal 425 is coupled to the I-bus 70 (of FIG. 1). Input terminal 415 is coupled to a first input terminal of an address buffer 410 and input terminal 425 is coupled to a second input terminal of address buffer 410. An output terminal of address buffer 410 is coupled to an input terminal of an error address register 420 to index and tag input terminals of a tag store 430. A control logic element 440 has a source select output terminal coupled to a control input terminal of the address buffer 410.

Error address register 420 contains a comparator 422. An output terminal of the comparator 422 is coupled to a same address input terminal of a control logic 440. A latch address output terminal of control logic element 440 is coupled to a control input terminal of the error address register.

Tag store 430 contains a parity checker/generator 432 and a tag comparator 434. An output terminal of parity checker/ generator 432 is coupled to a tag parity error input terminal of control logic 440, and an output terminal of the tag comparator 434 is coupled to a hit/miss input terminal of control logic 440. A transaction code output terminal of control logic element 440 is coupled to a control input terminal of tag store 430.

Control logic element 440 has a set 435 of two output terminals for indicating that an error has been detected during a memory access: an error transition mode (ETM) output terminal, coupled to memory interface 50, and an error output terminal, coupled to processor 30. In addition, control logic element 440 also includes a set 445 of three output terminals and two input terminals to enable it to share control of the local bus with the processor 30: a memory request input terminal; a ready output terminal; a retry output terminal; a bus request output terminal and a bus grant input terminal.

In operation, processor 30 (of FIG. 1) initiates a memory transfer by sending the desired address to the local bus input terminal of address buffer 410 through input terminal 415, and sending a signal indicating the type of memory access desired (for example, read or write) to the memory request input terminal of control logic element 440. Control logic element 440 then sends an appropriate signal to the address buffer 410 to pass the address at input terminal 415 through the address buffer to the tag store 430. One portion of the address signal from address buffer, called the index, is used to address one location of the memory in tag store 430. A second portion of the address signal, called the tag, is used to identify the main memory block stored in the corresponding block in cache RAMs 80. In addition, there are status bits associated with each tag entry. One bit, the valid bit, indicates whether the block designated by the tag entry may be accessed. A second bit, the dirty bit, indicates whether the block designated by the tag entry may be written to, or is read-only. Tag comparator 434 compares the tag portion of the requested address with the tag stored in the indexed memory location in tag store 430, checks the value of the corresponding status bits and generates a signal indicating the results of that operation. This signal is supplied to the control logic element 440 at the hit/miss input terminal.

If the tag stored in the indexed tag store location matches the tag of the requested address, and the status bits indicate that the block is valid (and dirty, in the case of a memory write request), then the corresponding block in the cache RAMs 80 contains the addressed location, and the memory transaction may be completed from cache memory. In that case, cache controller 40 generates the appropriate memory control signals for the cache RAMs 80 to complete the cache memory access.

If the tag stored in the indexed tag store location does not match the tag of the requested address, or the status bits indicate that the block is not valid (or not valid and dirty, in the case of a memory write request), then the corresponding block in the cache RAMs is not the block containing the desired address, and the memory access must be made from the main memory 10 (of FIG. 1). During the time the memory access to the main memory 10 is pending, the memory request from the processor 30 remains pending on the local bus 60.

Control logic element 440 sets an internal system pending latch 444 to indicate that a system memory request is in progress. The access to main memory 10 (of FIG. 1) is then made in a known manner and the desired information is transferred to (or from, in the case of a memory write) the processor 30 and the cache RAMs 80. When the transfer is complete, control logic element 440 resets the system pending latch 444, and sends a signal over the ready output terminal (445) to the processor 30 indicating that the memory request has been satisfied. In response to that signal, processor 30 then continues execution of its program. Then the cache fill is completed using the known direct memory access (DMA) technique controlled by the signals at the bus request and bus grant terminals (445) of the control logic element 440. Finally, the status bits in the indexed location in the tag store 430 are updated to indicate that the new block is now valid (and dirty, in the case of a memory write) in the cache RAMs 80.

Cache controller 40 performs the same comparisons described above for each of the memory accesses sent to it over the I-bus. For memory access checks from I-bus 70, a signal from the source select output terminal of control logic element 440 couples input terminal 425 to the error address register 420 and tag store 430. If the result of the comparison is a hit, and the block is not dirty, then the valid bit is reset, thus invalidating that block. If the result of the comparison is a hit, and the block is dirty, then the contents of that block are written-back from the cache RAMs 80 to the main memory through the local bus and memory interface 50 using the known DMA technique. When this write-back operation is completed, then the valid bit and dirty bit are both reset.

In the event of a cache miss, there may be some delay between the time that the memory interface 50 requests a main memory access and the time when that request is satisfied. This is because the system bus 20 must be shared among the processor modules, and because the requested memory address may reside in another processor module's cache memory and need to be written-back before the memory request may be satisfied. During that time delay, the memory request remains active on the local bus, as described above. But other memory accesses on the system bus 20 may be forwarded from the memory interface 50 to the cache controller 40 over the I-bus to determine whether invalidates or write-backs must be performed. If a write-back must be performed, then the pending memory request must be removed from the local bus so that the data transfer from the cache RAMs 80 to the main memory 10 through the memory interface 50 may take place over the local bus 60.

The control logic element 440 performs this by setting a read retry pending internal latch 446, and sending a signal to the processor 30 from the retry output terminal while simultaneously requesting control of the bus via the DMA channel bus request signal. When the retry and bus request signals are received by processor 30, it removes the memory access from the local bus 60 and grants control of the local bus 60 to the cache controller 40 by sending a signal to the bus grant input terminal of the control logic element 440. When processor 30 next receives control of the local bus 60, it will re-request the previous memory access in response to the retry signal.

Control logic element 440 then conditions the cache RAMs 80 to send the data to be written back over the local bus 60 through the memory interface 50 to the system bus 20 where it is routed to the main memory 10. Once the cache controller 40 has been granted control of the local bus 60 by processor 30, it retains control (for potential future required write-backs) until the memory request of processor 30 is satisfied by main memory 10.

When the memory interface 50 has received the requested data from main memory 10, it notifies the cache controller 40, which relinquishes control of the local bus 60. When the processor 30 regains control of the bus, it re-requests the memory access. Because the read retry latch is set, control logic element 440 knows that this is a retry of a memory access and that memory interface 50 has the requested data. Control logic element 440 resets the system pending latch 444 and the read retry latch 446, initiates the memory transfer from the memory interface 50 to the cache RAMs 80 and the processor 30, completes the following cache fill operation and updates the status information in the tag store 430.

Figure 3:
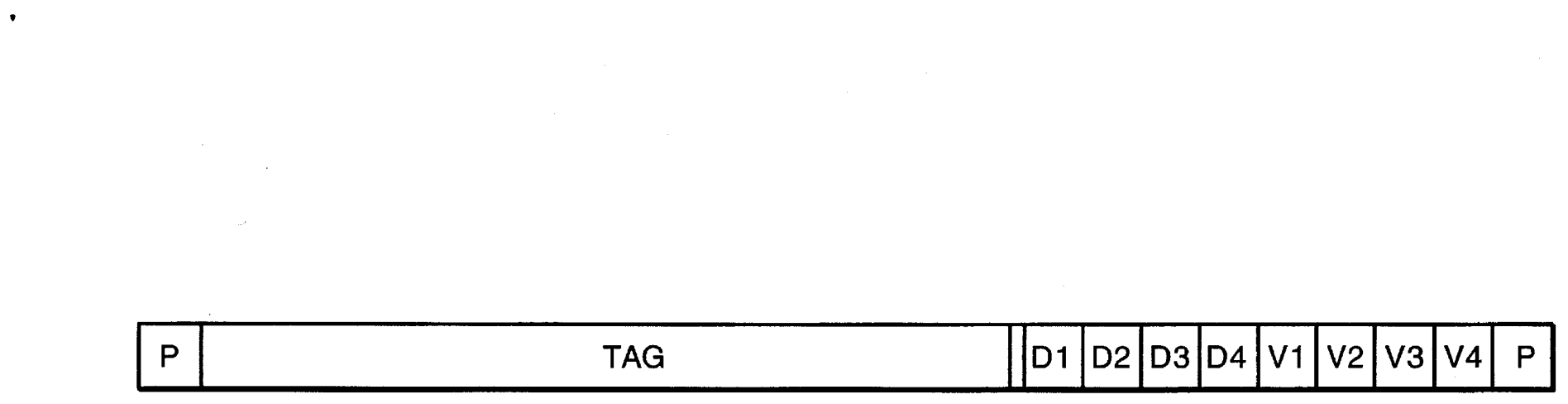

As described above, the reliability of the cache memory system may be increased by performing a parity check on the tag store 430. FIG. 3 is a diagram of the information in one location in the tag store 440. In FIG. 3, it can be seen that each location in the tag store 440 includes a tag and status bits for four subblocks (D1–D4 and V1–V4). In addition, two parity bits are included: one for the tag and one for the status bits.

Referring again to FIG. 2, a parity checker/generator 432 is included in tag store 430. Parity checker/generator 432 generates appropriate parity bits for the tag and status bits whenever a location in the tag store is updated, and checks the parity of the tag and status bit portions of the tag store and sends a signal to the tag parity error input terminal of the control logic element 440 if a parity error is detected.

When a parity error is detected, the cache enters the error transition mode (ETM). An internal ETM latch 442 is set and the processor is notified that a cache error has occurred by signals sent from the ETM output terminal (435). In addition, the complete address which was requested when the parity error occurred is latched into the error address register 420 in response to a signal sent by the control logic element 440 from the latch address output terminal. The processor 30 then starts to execute an interrupt program which attempts to reconstruct the contents of the tag store 430. The processor 30 may access the address stored in the error address register 420 during execution of the interrupt program for diagnostic purposes. In the course of executing this program, accesses to the tag store 430 continue. In addition, there continue to be accesses to the tag store 430 from the memory interface 50 via the I-bus 70.

If a second tag store location generates a parity error, while the cache memory is in ETM, there are no further resources for saving the address causing the error, and a full error condition is entered. Control logic element 440 notifies the processor 30 by a signal at the error output terminal (435). This is a fatal error and the processor 30 initiates an appropriate error routine in response.

While the cache memory is in ETM, only accesses to dirty blocks in the cache RAMs (which contain the only accurate copies of the data in the system) are processed from the cache RAMs. All other accesses are treated as if they were cache misses. Error address register 420 contains an index comparator 422. If, during the course of executing the interrupt program to correct the tag store, the same location in the tag store is accessed again, or if an invalidate or write-back request is received from the system bus 20 which accesses the same location in the tag store, then the parity checker/generator 432 again generates a parity error signal. Index comparator 422, however, generates a signal indicating that the index portion of the current address, which points to a location in the tag store, generating the current parity error is the same one as that which caused the cache memory to enter ETM in the first place. If all of: the ETM latch 442 signal, the tag parity error signal, and the same index signal are present, then the control logic element 440 knows that the same location in the tag store 430 which originally caused the cache memory to enter ETM has been accessed again, and will not issue another error signal to the processor 30, or change the state of the cache memory. Finally, control logic element 440 causes this memory access to be treated as a cache miss.

It is possible for the cache memory to enter ETM while a previous read access from the processor 30 was suspended to be retried later to allow for a write-back from cache RAMs 80 to main memory 10. As discussed above, it is important that this memory access be properly completed. Ordinarily, if the cache memory is in ETM, then all references which are not directed to dirty blocks are treated as misses. In the above situation, when processor 30 retries the access, the tag store 430 indicates that the desired location is not dirty, thus a cache miss would be generated. To properly complete the memory transaction, a cache miss is not generated if signals from all of: the ETM latch 442, the system pending latch 444, and the read retry pending latch 446 are all present. The presence of all three of these signals indicates that, although the cache is in ETM (indicated by the signal at the ETM latch 442), the current memory access from the processor 30 is a retry of an access which was initiated before the cache went into ETM (indicated by the signal at the system pending latch 444) but was pushed off the local bus 60 by a subsequent write-back (indicated by the signal at the read retry pending latch 446). This access must be completed. Because a cache miss is not generated, this access may be properly completed.

Figure 4:
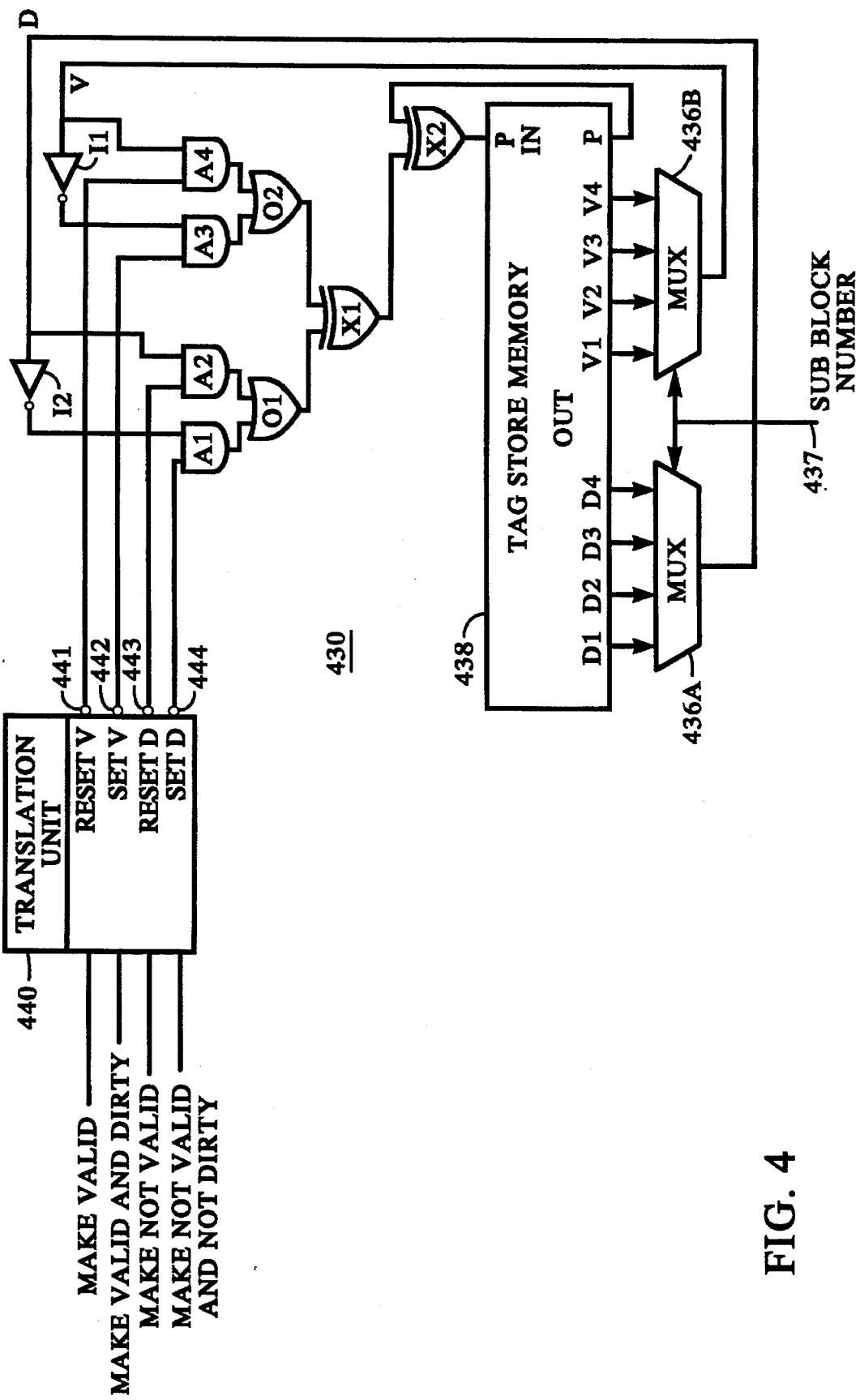
FIG. 4 is a diagram partially in block form and partially in logic diagram form of a portion of a parity checker/generator for the tag store illustrated in FIG. 2.

FIG. 4 is a diagram partially in block form and partially in logic diagram form of the parity generator portion of the parity checker/generator 432 for the tag store 430 illustrated in FIG. 2. Parity checkers for the tag and status bits have been omitted for clarity. One skilled in the art would understand where these parity checkers should be and what interconnections would be required to make them perform properly. In FIG. 4, an input terminal 437 is coupled to a source (not shown) of a subblock select signal which is derived from the address signal supplied to the tag store 430 from address selector 410 (of FIG. 2). This subblock select signal selects which subblock of the current block is being updated. The subblock select signal is coupled to respective control input terminals of multiplexers 436A and 436B. Respective data input terminals of multiplexer 436A are coupled to dirty status output terminals D1 to D4 of a tag store memory 438. Respective data input terminals of multiplexer 436B are coupled to valid status output terminals V1 to V4 of tag store memory 438. A parity output P terminal of tag store 430 is coupled to a first input terminal of an exclusive-OR gate X2.

A data output terminal of multiplexed 436B is coupled to an a first input terminal of an AND gate A4 and an input terminal of logic inverter I1. An output terminal of inverter I1 is coupled to a first input terminal of an AND gate A3. An output terminal of AND gate A4 is coupled to a first input terminal of an OR gate O2, and an output terminal of an AND gate A3 is coupled to a second input terminal of OR gate O2. An output terminal of OR gate O2 is coupled to a first input terminal of exclusive-OR gate X1. An output terminal of exclusive-OR gate X1 is coupled to a second input terminal of an exclusive-OR gate X2. An output terminal of exclusive-OR gate X2 is coupled to a parity input terminal P of tag store memory 438.

A data output terminal of multiplexer 436A is coupled to a first input terminal of an AND gate A2 and an input terminal of a logic inverter I2. An output terminal of inverter I2 is coupled to a first input terminal of an AND gate A1. An output terminal of AND gate A2 is coupled to a first input terminal of an OR gate O1, and an output terminal of AND gate A1 is coupled to a second input terminal of OR gate O1. An output terminal of OR gate O1 is coupled to a second input terminal of exclusive-OR gate X1.

A reset V input terminal 441, a set V input terminal 442, a reset D input terminal and a set D input terminal 444 are all coupled to a source (TRANSLATION UNIT 440) which translates the four transactions which can occur to a subblock of data in the tag store (make valid, make valid and dirty, make not valid, and make not valid and not dirty) into four signals which relate directly to the status bits stored in the tag store 430. This translation source (TRANSLATION UNIT 440) may, for example, be combinatorial logic or a look-up table stored in a read-only memory. The reset V input terminal is coupled to a second input terminal of AND gate A4. The set V input terminal is coupled to a second input terminal of AND gate A3. The reset D input terminal is coupled to a second input terminal of AND gate A2. The set D input terminal is coupled to a second input terminal of AND gate A1.

In operation, multiplexer 436A selects the previously stored dirty bit D for the subblock currently being updated, and multiplexer 436B selects the previously stored valid bit V for the subblock currently being updated. The combination of AND gates A3 and A4, inverter I1 and OR gate O2 determine whether the selected valid bit is going to change.

If the previously stored valid bit V is a logic '1', the set V line is a logic '0' and the reset V line is a logic '1', (indicating that the valid bit is to be reset to a logic '0' level) then the valid bit is going to change. The output of AND gate A4 will be a logic '1'. At the same time, the output of inverter I1 will be a logic '0', thus, the output of AND gate A3 will be a logic '0'. In this case the output of OR gate O2 will be a logic '1'.

Conversely, if the previously stored valid bit V is a logic '0', the set V line is a logic '1' and the reset V line is a logic '0', (indicating that the valid bit is to be set to a logic '1' level) then, again, the valid bit is going to change. The output of the AND gate A4 will be a logic '0'. At the same time, the output of inverter I1 will be a logic '1', thus, the output of AND gate A3 will be a logic '1'. In this case, also, the output of OR gate O2 will be a logic '1'.

However, if the previously stored valid bit V is a logic '0', the reset V line is a logic '1' and the set V line is a logic '0', (indicating that the valid bit is to be reset to a logic '0' level) then the valid bit is not going to change. The output of the AND gate A4 will be a logic '0'. At the same time, the output of inverter I1 will be a logic '1', but, the output of AND gate A3 will be a logic '0'. In this case the output of OR gate O2 will be a logic '0'.

Again conversely, if the previously stored valid bit V is a logic '1', the reset V line is a logic '0' and the set V line is a logic '1', (indicating that the valid bit is to be set to a logic '1' level) then, again, the valid bit is not going to change. The output of the AND gate A4 will be a logic '0'. At the same time, the output of inverter I1 will be a logic '0', thus, the output of AND gate A3 will also be a logic '0'. In this case the output of OR gate O2 will be a logic '0'. In short, if the output of OR gate O2 is a logic '1' signal, then the valid bit is changing.

The combination of AND gates A1 and A2, inverter I2 and OR gate O1 operate in a similar manner to determine whether the selected dirty bit is changing. That is, if the output of OR gate O1 is a logic '1' signal, then the dirty bit is changing. The parity will change if either the valid bit or the dirty bit changes level (an odd number of bits), but not if both (or neither) (an even number of bits) changes level. Exclusive-OR gate X1 produces a logic '1' signal if one of the output signals from OR gates O1 and O2 are logic '1' signals, but produces a logic '0' signal if both or neither of the output signals from OR gates O1 and O2 are logic '1' signals. The output signal from exclusive-OR gate X1 is a toggle signal for the parity signal. Exclusive-OR gate X2 performs the selective toggling of the parity bit in response to this toggling signal.

The circuitry described above is simpler and faster than a standard eight input parity tree of exclusive-ORs. The updated parity bit at the parity input terminal of tag store 430 may be stored in the tag store in the next cycle following the access of the status bits.

What is claimed is:

1. An apparatus comprising:

means for storing a plurality of bits;

means for storing a parity bit representative of parity of said plurality of bits;

means, responsive to a plurality of update signals from a processor, for providing a plurality of inversion signals, said plurality of inversion signals corresponding to said stored plurality of bits and indicating an updated state of said bits;

means for comparing each of said plurality of inversion signals to a corresponding one of said stored plurality of bits including means, responsive to a miscompare between said plurality of inversion signals and said plurality of bits, for determining a subset of said plurality of bits to invert;

means, responsive to said means for comparing, for providing a toggle signal if said subset of bits to invert comprises an odd number of bits; and means, responsive to said toggle signal, for inverting the level of said parity bit.

2. An apparatus comprising:

means for storing a plurality of bits;

means for storing a parity bit representative of the parity of said plurality of bits;

means for providing a plurality of set signals, each of said set signals associated with one bit of a subset of bits of said plurality of bits an indicating an updated state of said bit;

means for providing a plurality of reset signals, each of said reset signals associated with one bit of said subset of bits of said plurality of bits, and indicating an updated state of said bit;

means, responsive to said set signals and said reset signals, for comparing each of said set signals and said reset signals to said associated bit of said subset of bits to determine a number of said subset of bits to invert by said set signals and said reset signals;

means for generating a toggle signal only if the number of said subset of bits to invert is odd; and means, responsive to said toggle signal, for inverting the binary value of said parity bit.

3. A method comprising the steps of:

providing a plurality of bits;

providing a parity bit corresponding to the parity of said plurality of bits;

providing a plurality of inversion signals corresponding to said plurality of bits, each of said inversion signals indicating an updated state of said corresponding bit;

comparing each inversion signal of said plurality of inversion signals to said corresponding bit of said plurality of bits to determine a subset of said plurality of bits to invert; generating a toggle signal if said subset of said plurality of bits to invert consists of an odd number of bits; and inverting the level of said parity bit in response to said toggle signal.

4. The method as recited in claim 3 wherein said determining step further comprises the steps of:

providing a plurality of set signals, each of said set signals corresponding to one bit of a subset of bits of said plurality of bits, and indicating an updated state of said corresponding bit;

providing a plurality of reset signals, each of said reset signals corresponding to one bit of said subset of bits of said plurality of bits, and indicating an updated state of said corresponding bit; and comparing each of said set signals and said reset signals to said corresponding bit of said said subset to determine a number of bits of said subset to invert.

* * * * *